(12) United States Patent
Crivello

(10) Patent No.: US 6,602,602 B1
(45) Date of Patent: Aug. 5, 2003

(54) EPOXY-FUNCTIONAL POLYMERIC MICROBEADS

(75) Inventor: James Vincent Crivello, Clifton Park, NY (US)

(73) Assignee: Renssealer Polytechnic Institute, Troy, NY (US)

( * ) Notice: Subject to any disclaimer, the term of this patent is extended or adjusted under 35 U.S.C. 154(b) by 0 days.

(21) Appl. No.: 10/019,835

(22) PCT Filed: Apr. 26, 1999

(86) PCT No.: PCT/US99/07337

§ 371 (c)(1),
(2), (4) Date: May 8, 2002

(87) PCT Pub. No.: WO00/64572

PCT Pub. Date: Nov. 2, 2000

Related U.S. Application Data (60) Provisional application No. PCT/US99/07337, filed on Apr. 26, 1999.

(51) Int. Cl.⁷ .................................................. A61K 9/14
(52) U.S. Cl. ........................ 428/402; 424/489; 522/170
(58) Field of Search .......................... 522/170; 428/402; 424/489

(56) References Cited

U.S. PATENT DOCUMENTS

| | | | | |
|---|---|---|---|---|
| 4,698,262 A | * | 10/1987 | Schwartz et al. | 428/402 |
| 4,774,189 A | | 9/1988 | Schwartz | 436/10 |
| 5,080,994 A | * | 1/1992 | Breton et al. | 430/137 |
| 5,084,394 A | | 1/1992 | Vogt et al. | 436/8 |
| 5,872,194 A | * | 2/1999 | Isshiki et al. | 525/476 |
| 6,210,790 B1 | * | 4/2001 | Crivello | 428/325 |
| 6,346,353 B1 | * | 2/2002 | Wang et al. | 430/14 |
| 6,365,189 B1 | * | 4/2002 | Quong | 424/489 |

* cited by examiner

*Primary Examiner*—Margaret G. Moore
(74) *Attorney, Agent, or Firm*—Heslin Rothenberg Farley & Mesiti P.C.; Mary Louise Gioeni, Esq.

(57) ABSTRACT

Epoxy-functionallized polymeric microbeads and dispersions thereof may be prepared using a cationic non-aqueous dispersion-suspension photopolymerization. The polymeric microbeads may be further modified with a variety of additional groups by reaction with various reagents with the epoxy moities.

26 Claims, 4 Drawing Sheets

EPOXY-FUNCTIONAL POLYMERIC MICROBEADS

CROSS REFERENCE TO RELATED APPLICATION

This application claims priority of U.S. Provisional Application, Ser. No. 60/080,722, filed Apr. 3, 1998, the disclosure of which is incorporated herein by reference.

TECHNICAL FIELD

The present invention relates to epoxy-functional polymeric microbeads that may be prepared by suspension polymerization.

BACKGROUND OF THE INVENTION

Several methods for the preparation of polymeric microbeads for chromatographic separations have been developed over the past several decades. Typically, these methods involve the free radical suspension polymerization of a mono- and a difunctional vinyl monomer in water. In addition, if a high surface area is desired, macroporous beads with a large internal pore structure can be produced by the incorporation of a porogen consisting of a solvent or a polymer or a mixture of both. Typically, these techniques result in the formation of microbeads with a wide distribution of sizes. Recently, there has been much activity in this field directed towards the generation of functionallized macroporous microbeads for chromatographic separations of specific compounds and for the separation of chiral compounds. This field is highly active at the present time and the chief goal is to prepare macroporous microbeads to efficiently achieve the above separations in the pharmaceutical industry.

Ultraviolet curable monomers are of increasing current interest for such applications as coatings, inks, adhesives and composites because they provide materials which are ecologically attractive. Such monomers are typically employed without the use of solvents and are very efficiently converted to polymers in a very short time during polymerization resulting in no environmental consequences for either water or air pollution. The use of such chemistry for the preparation of functionallized macroporous microbeads has not been described. In particular, the use of the photo-initiated cationic polymerization of epoxide monomers for this purpose has not been reported.

SUMMARY OF THE INVENTION

In one aspect, the present invention relates to a population of polymeric microbeads bearing epoxy functionality on surfaces thereof and having a narrow particle size distribution, such that the particle size of greater than 90% of the polymeric microbeads in said population is equal to±20% of the mean particle size. In a preferred embodiment.the epoxy functionality arises from one or more multifunctional epoxy monomers chosen from the group consisting of: 3,4-epoxycyclohexyl methyl-3',4'-epoxycyclohexane carboxylate, bis-(3,4-epoxycyclohexyl), adipate, 4-vinylcyclohexene dioxide, epoxy silicone resins, limonene dioxide, dicyclopentadiene dioxide, bisphenol-A diglycidyl ether, bisphenol-F diglycidyl ether, 1,4-butanediol diglycidyl ether, diglycidyl ethers of tetrabromo-bisphenol-A, epoxy cresol novolacs, epoxy phenol novolacs, and diglycidyl phthalate. More preferably, the epoxy functionality arises from one or more multifunctional epoxy monomers chosen from the group consisting of: 3,4-epoxycyclohexyl methyl-3',4'-epoxycyclohexane carboxylate, 4-vinylcyclohexene dioxide and the compounds of formula I and II:

The polymeric microbeads may derived from the copolymerization of one or more multifunctional epoxy monomers and one or more cationically polymerizible comonomers. Preferably, the cationically polymerizible comonomers are chosen from the group consisting of: 1,2-epoxytetradecane, 1,2-epoxydecane, 1,2-epoxydodecane, epoxidized soybean oil, epoxidized linseed oil, vinyl ethers, 1-propenyl ethers, 1-butenyl ethers, styrene, indene, acenapthalene, a-methylstyrene, N-vinyl carbazole, oxazoline, tetrahydrofuran, 7-oxabicyclo[2.2.1]heptane, oxetane, substituted oxetanes, thirane, and aziridine.

In another aspect, the present invention relates to polymeric microbeads prepared by suspension photopolymerization of one or more multifunctional epoxy monomers. Preferably, the dispersion comprises a non-aqueous suspending medium. Polymerization is initiated by a cationic photoinitator.

In yet another aspect, the invention relates to a dispersion of polymeric microbeads prepared by suspension photopolymerization of one or more multifunctional epoxy monomers. Preferably, the multifunctional epoxy monomers are copolymerized with one or more cationically polymerizible comonomers.

In yet another embodiment, the present invention relates to a process for the preparation of polymeric microbeads comprising:

(A) forming a dispersion comprising one or more multifunctional epoxy monomers in a non-aqueous suspending medium in the presence of a photoinitiator; and (B) exposing the dispersion to a source of light to induce polymerization.

In yet another aspect, the present invention relates to a method for attaching functional groups.to the surface of a polymeric microbead comprising:

(A) preparing a dispersion of polymeric microbeads bearing residual epoxy groups on surfaces as described above and (B) contacting the polymeric microbeads with a compound which is reactive toward the residual epoxy groups.

DETAILED DESCRIPTION OF THE INVENTION

The present invention relates to polymeric microbeads that are derived from one or more multifunctional epoxy monomers, and that bear residual epoxy functionality on the surfaces thereof. The polymeric microbeads also have a narrow particle size distribution. The epoxy groups on the surface of the microbeads are residual or unpolymerized epoxy groups that are bound to the microbead through a reacted or polymerized epoxy group. Multifunctional epoxy monomers that may be polymerized to form the polymeric microbeads of the present invention include: cycloaliphatic diepoxides such as 3,4-epoxycyclohexylmethyl-3',4'-epoxycyclohexane carboxylate, bis-(3,4-epoxycyclohexyl) adipate, and 4-vinylcyclohexene dioxide, epoxy silicone resins, including I and II below, limonene.dioxide, dicyclopentadiene dioxide, bisphenol-A diglycidyl ether, bisphenol-F diglycidyl ether, 1,4-butanediol diglycidyl ether, diglycidyl ethers of tetrabromo-bisphenol-A, epoxy cresol novolacs, epoxy phenol novolacs, and diglycidyl phthalate. Preferred epoxy monomers are 3,4-epoxycyclohexylmethyl-3',4'-epoxycyclohexane carboxylate, 4-vinylcyclohexene dioxide, limonene dioxide and I and II. Limonene dioxide and 3,4-epoxy cyclohexylmethyl-3,4-epoxycyclohexane carboxylate, are available from the SEM Corporation, and Ciba Geigy Corporation, respectively. I and II are available as PC 1000 and T8, respectively, from Polyset Chemical, Mechanicville, N.Y. The preparation of I, 1,3-di-2-(3,4-epoxy cyclohexyl) ethyl-1,1,3,3-tetramethyldisiloxane, is described in Crivello, J. V. and Lee, J. L., *J Polymer Sci., Polym. Chem. Ed.*, pg. 479,1990.

I

II is prepared according to the method described by Crivello (Crivello, J. V. and Mao, Z., *Chem Mater.* 1997, 9, 1554–1561).

In a preferred embodiment, the polymeric microbeads are prepared by a suspension polymerization process. More preferably, the polymeric microbeads are prepared by a suspension polymerization process which is initiated by a cationic photoinitiator.

Where the polymeric microbeads are prepared by cationic suspension photopolymerization, the one or more epoxy monomers may be copolymerized with one or more cationically photopolyinerizible monomers, including monofunctional epoxy monomers such as 1,2-epoxytetradecane, 1,2-epoxydecane, 1,2-epoxydodecane, epoxidized soybean oil, epoxidized linseed oil. Other cationically polymerizible monomers that may be used are cycloaliphatic epoxy alcohols, vinyl ethers, 1-propenyl ethers, 1-butenyl ethers, styrene, indene, acenapthalene, α-methylstyrene, N-vinyl carbazole, oxazoline, tetrahydrofuran, 7-oxabicyclo[2.2.1]heptane, oxetane, substituted oxetanes, thirane, and aziridine.

In another embodiment, the present invention relates to a dispersion of polymeric microbeads prepared by suspension photopolymerization of one or more epoxy mononomers. The polymeric microbeads are composed of an epoxy resin derived from one or more multifunctional epoxy monomers. One or more cationically polymerizible comonomers may be copolymerized as described above The polymeric microbeads are dispersed in a suspending medium. Preferably, the suspending medium is non-aqueous. Exemplary materials which may be used as a suspending medium are mineral oil, straight chain and branched high and low molecular weight hydrocarbons, dialkyl ethers such as dioctyl and dibutyl ether. dialkyl ethers of polyethylene glycol, dibutylketone, dihexylketone, diphenyl ether, anisole, phenetole, phenyl butyl ether, a mixture of diphenyl ether and biphenyl and commercially available poly(dimethylsiloxane) (silicone) oils. Mixtures of diphenyl ether and biphenyl are available from Dow as the Dowtherm series.

In yet another embodiment, the present invention relates to a process for the preparation of polymeric microbeads that bear residual epoxy functionality on the surfaces thereof. The process comprises the steps of forming a dispersion comprising one or more multifunctional epoxy monomers in a non-aqueous suspending medium in the presence of a photoinitiator; and exposing the dispersion to a source of light to induce polymerization.

Figure 1:
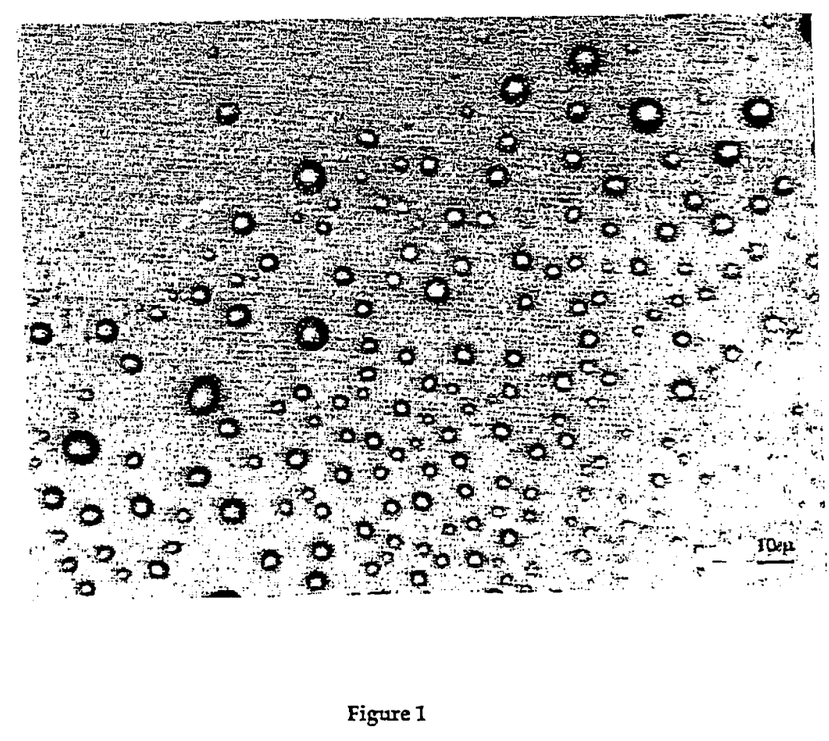
FIG. 1 is a photograph of polymeric microbeads of the present invention showing particle size distribution.
Figure 2:
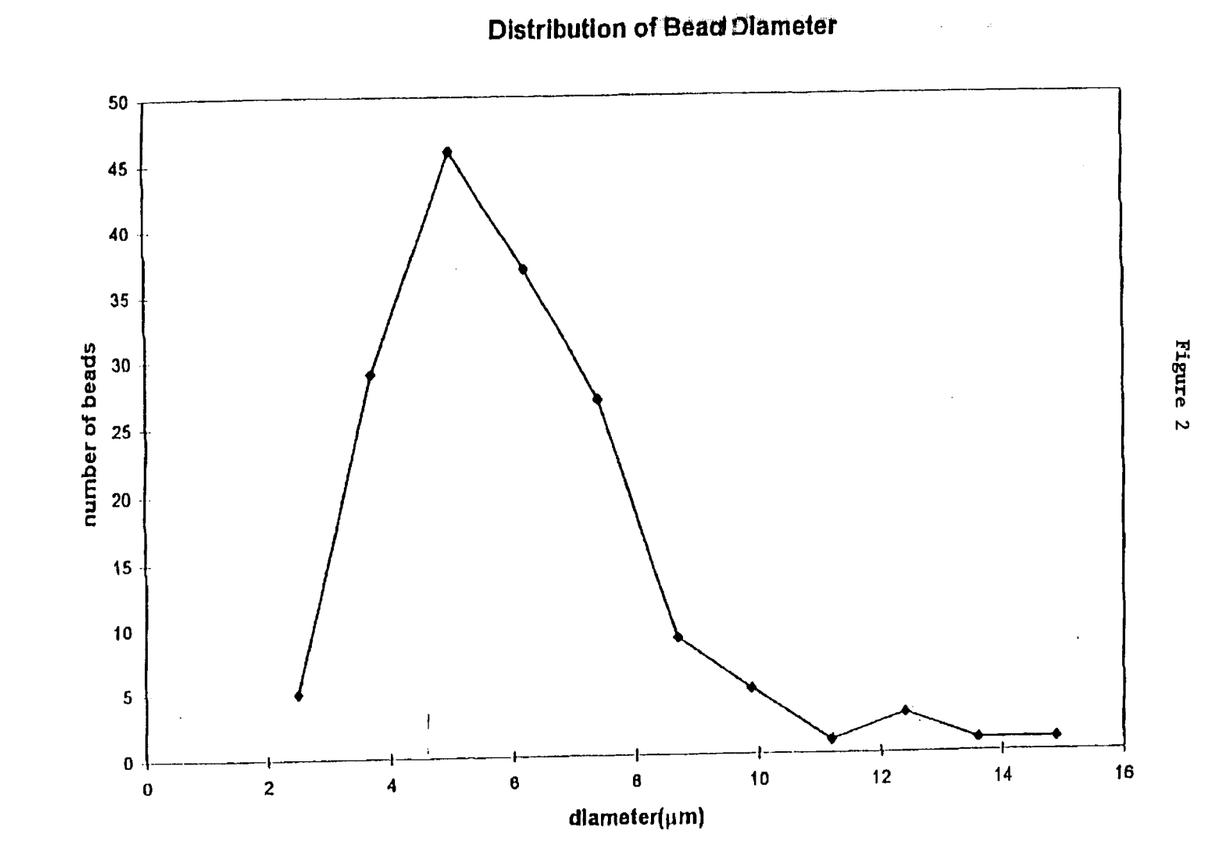
FIG. 2 is a graph of particle size of the particles shown in the photograph in FIG. 1.

In processes of the present invention, the monomer(s) are dispersed in an appropriate suspending medium, such as those described above. A suspending medium with minimum solubility for the monomers is preferred. The viscosity of the suspending medium is typically a major factor in determining the particle size of the resulting polymeric microbeads, along with process parameters such as stirring rate and temperature. Therefore, particle size may be manipulated by choice of suspending medium, surfactant level and type, temperature, and stirring rate. The particle size of the resulting polymeric microbeads ranges from 1 $\mu$m to 500 $\mu$m, preferably from 10 $\mu$m to 300 $\mu$m. The polymeric microbeads also have a narrow particle size distribution, as shown in FIGS. 1 and 2. A narrow particle size distribution is defined as where the particle size of greater than 90% of the polymeric microbeads in said population is equal to±20% of the mean particle size. The particle size of agglomerated particles is taken as the width of the mass at its widest point. The figures show the particle size distribution of an exemplary group of polymeric microbeads. FIG. 1 is a photograph of polymeric microbeads produced by suspension photopolymerization. FIG. 2 is a graph showing the distribution of particle size of the particles.

One or more surfactants may be used to stabilize the dispersion. The dispersion may contain up to 10% surfactant based on the weight of monomer. Suitable surfactants include both ionic and nonionic surfactants. Examples of nonionic surfactant include block copolymers such as the Pluronics® and Tectonics® commercially available from BASF and esters of polyethylene glycol included in the Tween® series available from ICI Surfactants. In some cases, these surfactants may also serve as porogens.

Such porogens or pore-generating substances generally consist of solvents or polymers or combinations of the two. The dispersion may contain one or more porogens. Typically, these porogens are soluble in the mixture of monomers used but not soluble in the suspending median. Examples of porogens are acetone, methyl ethyl ketone, chlorinated hydrocarbons, polystyrene, polymethyl methacrylate, polyethylene oxide, and pinene resins. After photopolymerization, the porogen is usually removed from the crosslinked microbeads by extraction with a suitable solvent.

Initiators useful for polymerization are cationic photoinitiators such as onium salts. These are diaryliodonium salts, triarylsulfonium salts, diaryliodosonium salts, triarylsulfoxonium salts, dialkylphenacylsulfonium salts, dialkyl (hydroxy dialkylphenyl)sulfonium salts and ferrocenium salts. Such onium salts may be modified by the attachment of alkyl, alkoxy, siloxy and the like groups without decreasing their utility. Suitable cationic photoinitiators include, for example, (4-n-decyloxyphenyl) phenyliodonium hexafluoroantimonate, 4-(2-hydroxytetra decyloxyphenyl) phenyliodonium hexafluoroantimonate, and commercially available triarylsulfonium salt photoinitiators such as UV691 available from the Union Carbide Corporation. A preferred initiator is (4-n-decyloxyphenyl) phenyliodonium hexafluoroantimonate. 4-(2-Hydroxytetradecyloxyphenyl) phenyliodonium hexafluoroantimonate is sold under the tradename Sarcat CD-1012, and triarylsulfonium salt is sold as Sarcat CD-1010, both by Sartomer Chemical Co. Typically, the photoinitiator is employed in concentrations ranging from 0.1 to 10% by weight based on the monomer or monomers. The photoinitiator is typically soluble in the monomer or mixture of monomers, but exhibits minimal solubility in the suspending medium.

The dispersion may additionally contain a photosensitizer. The function of a photosensitizer is to change the wavelength of sensitivity for the initiator. For example, polymerizations can be conveniently carried out employing visible light provided that a photosensitizer is also included in the dispersion. In addition, by employing a photosensitizer, it is possible to accelerate the polymerization and hence, the formation of the microbeads. Among the many useful photosensitizers which may be used are anthracene, phenanthracene, pyrene, peryiene, thioxanthone. 2-chlorothioxanthone, 2-isopropylthioxanthone, anthraquinone, camphorquinone, 1,4diphenylbutadiyne, acridine orange, acridine red, hematoporphrin, and phosphine R. The choice of the photosensitizer and its concentration will depend on the specific photoinitiator which is used. Typically the photosensitzer is employed in a concentration ranging from 10 to 50% by weight, based on the weight of the photoinitiator.

Accelerators may also be employed for the polymerization. Examples of suitable accelerators are alcohols, inclusing ethanol, ethylene glycol, triethylene glycol, glycerol, pentaerythritol, and hydroxy-functional oligomers and polymers, including hydroxyl-terminated polyesters and hydroxyl-terminated polyethers.

Figure 3:
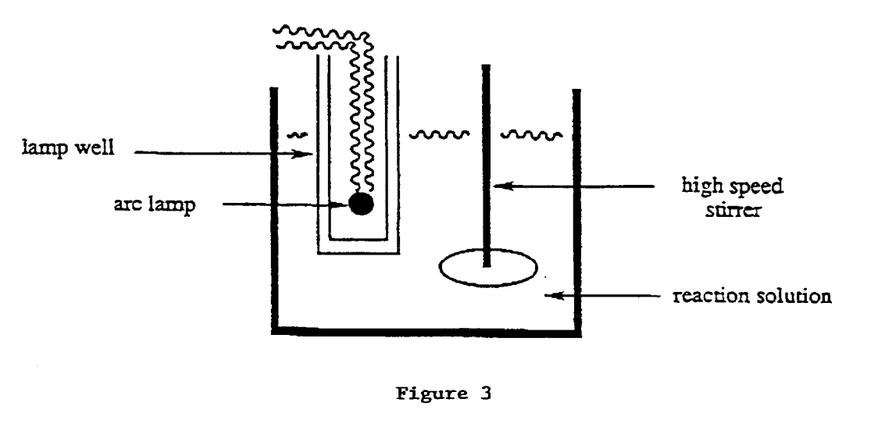
FIG. 3 shows an exemplary reactor having a high speed stirrer for agitation and a lamp well for transmitting light into the reaction medium.
Figure 4:
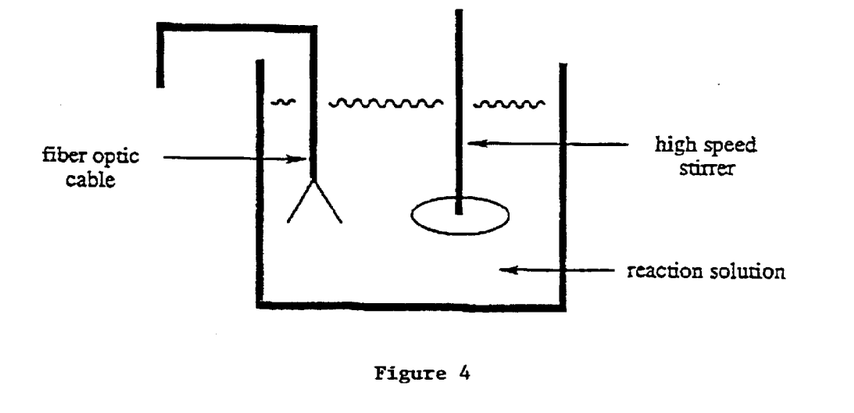
FIG. 4 shows an exemplary reactor having a high speed stirrer for agitation and a fiber optic cable for transmitting light into the reaction medium.
Figure 5:
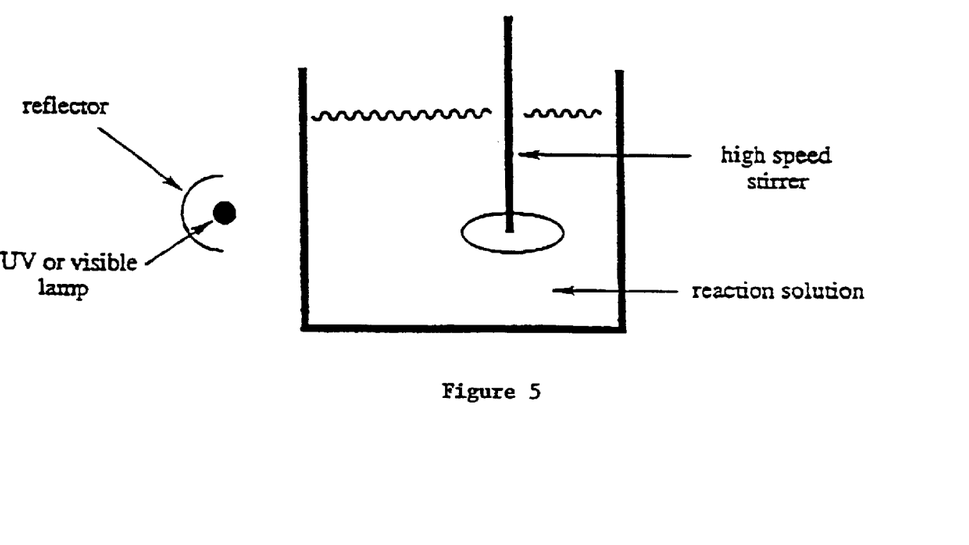
FIG. 5 shows an exemplary reactor having a high speed stirrer for agitation and a transparent window for transmitting light from a lamp fitted with a reflector into the reaction medium.
Figure 6:
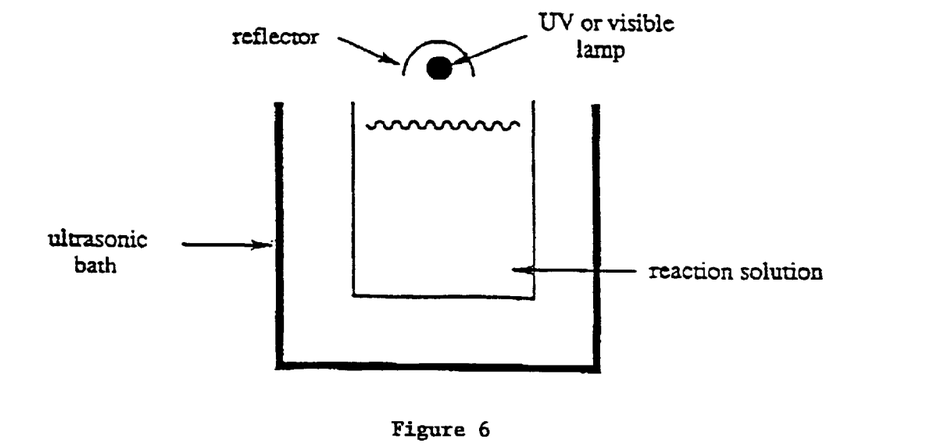
FIG. 6 shows an exemplary reactor having an ultrasonic bath for agitation and direct transmission from a lamp fitted with a reflector into the reaction medium.

An apparatus for preparation of the polymeric microbeads typically includes means of dispersing the monomer(s), a temperature controller, and a source of light. FIGS. 3 through 6 illustrate exemplary methods of agitating the dispersion and of exposing the dispersion to a source of light. FIGS. 3, 4 and 5 show the use of a high speed stirrer for agitation of the dispersion. In FIG. 3, an arc lamp enclosed in a lamp well serves as a source of light. FIG. 4 shows how the light may be conducted into the reaction medium via a fiber optic cable. In FIG. 5, light is conducted through a light-transparent reaction vessel. FIG. 6 illustrates the use of an ultrasonic bath for agitation of the reaction medium, and direct transmission of light from a lamp positioned above the reaction medium.

In another embodiment, the present invention relates to a method for attaching functional groups to the surface of a polymeric microbead comprising preparing a dispersion of polymeric microbeads bearing residual epoxy groups on surfaces. The dispersion comprises the one or more multifunctional epoxy monomers and, if desired, the cationically photopolvmerizible monomers described above, in a nonaqueous suspending medium in the presence of a photoinitiator. After exposing the dispersion to a source of light to induce polymerization, the polymeric microbeads may be contacted with a compound which is reactive toward the residual epoxy groups, including acid anhydrides, alcohols, amides, amines, carboxylic acids, isocyanates, Grignard reagents, and thiols. Other types of compounds that are reactive toward epoxy groups and that are useful for attaching functionality to the surface of the bead include acetals, acetoacetates, acetonitriles, acetylenes, acyl halides, alkyl halides, alkyl hydroperoxides, amines, aminothiols, ammonia, antimony trihalides, arsinic trihalides, aryldichloroarsines, aryllithiums, azides, carbamyl halides, carbon dioxide, carbon disulfide, cyanates, cyanoacetates, diborane, ethylene imine, halohydrins, hydrogen cyanide, hydrogen sulfide, ketones, malonates, nitrogen dioxide, nitrosyl chloride, phenols, phosgene, phosphines, phosphoric acid, phosphorous acid, phosphorous oxychloride, phthalimide, silicon tetrahalides, sodium sulfite, sulfur dioxide, sulfuryl chloride, thiocyantes, thiocyanic acid, thiolacids, thionyl chloride, thiosulfates, water and many others. Others may be found in the literature, including *Handbook of Epoxy Resins*, Lee and Neville, 1967, p 2–32.

The polymeric microbeads may be directly employed for a variety of final applications. Some exemplary applications are supports for the chromatographic separations of simple compounds, ion exchange resins, polymer-bound catalysts, polymer-bound reagents, diagnostic reagents for the binding of enzymes and catalytic antibodies, and reagents for peptide and polynucleic acid synthesis.

Appropriately derivitized polymeric microbeads may also be used for these purposes. The highly reactive pendent epoxy groups may be converted to many different functional groups by reaction with a suitable reagent. Epoxy functionallized beads are ideal for this purpose since the epoxy groups are highly reactive towards such a wide variety of reagents. Reactions of epoxy groups have been extensively described in the chemical literature, as noted above, and a person of ordinary skill in the art is able to prepare desired derivatives of the epoxy groups on the surface of the polymeric microbeads without undue experimentation.

The use of polymeric microbeads bearing functional groups allows the beads to interact in various manners with other molecules of interest. For example, reaction with a chiral amine results in the bonding of this species to the surface of the microbead producing a bead with essentially a chiral surface. Such beads are be useful for the chiral separation of enantiomers. This process is of critical interest to the pharmaceutical industry since the separation of stereoisomeric drugs into their respective enantiomers is widely practiced today by laborious and expensive methods. The use of chiral microbead chromatography provides a simple, direct and low cost method of separation of these substrates.

Using the similar chemical transformations, the microbeads may be fitted with a variety of diagnostic agents. These beads can be employed for blood and urine tests for glucose, drug metabolites, and for the presence of bacterial and viral infectious agents.

Functionallized microbeads can be used directly as prepared in various uses such as catalysts in transition metal, acid and base mediated reactions Similarly, polymer bound enzymes and catalytic antibodies can be directly added to reaction mixtures to achieve their desired action. Alternatively, they may be assembled into columns and the substrate passed through a solid phase bed of the microbeads to produced the desired reaction. They may also be incorporated into column form for use in high pressure liquid chromatography, preparative liquid chromatography and gas chromatography.

EXPERIMENTAL

Tables 1 and 2 show the composition of the dispersions prepared and the resulting bead size and epoxy content. The photopolymerizations were carried out in a 100 ml reaction vessel equipped with a mechanical paddle stirrer and a General Electric 150 W lamp. The reaction mixtures were stirred for a brief time to suspend the monomer mixture and then the lamp was switched on for 30 minutes. The polymeric microbeads were recovered by suction filtration and washed with an appropriate solvent to remove the suspending medium. The beads were characterized by optical microscopy. In the tables, VCHDO is 4-vinylcyclohexene dioxide, DEN 439 is an epoxy novolac available from Dow, and ELO is an epoxidized linseed oil. Tween 80 is a nonionic surfactant obtainable from ICI Surfactants.

TABLE 1

Synthesis of Microbeads by Photopolymerization of Epoxy Monomers[+]

| Suspending Medium | Monomer Composition (g) | | | | | | Tween 80* (g) | Bead Size ($\mu$m) | Epoxy Content (meq/100 g)[†] |
| --- | --- | --- | --- | --- | --- | --- | --- | --- | --- |
| | PC-1000 | CY-179 | T8 | VCHDO | DEN439 | ELO | | | |
| Water | 10 | — | — | — | | — | 0.02 | no pzn. | — |
| Hexane | — | 10 | — | — | | — | 0.06 | >100 | — |
| Hexane | 2.5 | 7.5 | — | — | | — | 0.13 | >100 | — |
| Hexane | 2.5 | 7.5 | — | — | | — | 0.25 | >50 | — |
| Mineral Oil | 2.5 | 7.5 | — | — | | — | 0.25 | 25–35 | 4.78 |
| Mineral Oil | — | 7.5 | 2.5 | — | | — | 0.42 | aggl.[#] | — |
| Mineral Oil | — | — | 2.9 | 7.1 | | — | 0.52 | aggl.[#] | 40.14 |
| Mineral Oil | 2.5 | 7.5 | — | — | — | — | — | 25–35 | 5.50 |
| Mineral Oil[a] | — | 5.0 | — | — | 5.0 | — | — | aggl.[#] | — |
| Mineral Oil[b] | — | 7.0 | — | — | 3.0 | — | — | aggl.[#] | — |
| Silicone Oil (50 cts) | — | 7.0 | — | — | — | 3.0 | — | 6.8–38 | 51.2 |
| Silicone Oil (50 cts) | — | 3.0 | 7.0 | — | — | — | — | 5–20 | 164[c] |

[+]All compositions contained 40 mL of the dispersing medium, 0.2 g of (4-octyloxyphenyl) phenyliodonium hexafluoroantimonate (IOC-8) and 0.02 g perylene. Photopolymerizations were conducted for 30 minutes using a GE 150 W spotlight.
*Suspending agent.
[†]Determined by titration.
[#]Agglomeration of the beads occurred.
[a]Reaction temperature 60° C.
[b]Reaction temperature 55° C.
[c]Contains 6.2 g nitromethane as a porogen.

TABLE 2

Synthesis of Microbeads by Photopolymerization of Epoxy Monomers[+]

| Suspending Medium | Monomer Composition (g) | | | | | | Light Source | Porogen[a] | Epoxy Content (meq/100 g)[†] |
| --- | --- | --- | --- | --- | --- | --- | --- | --- | --- |
| | PC-1000 | CY-179 | T8 | VCHDO | DEN439 | ELO | | | |
| Mineral Oil | — | — | 29 | 71 | — | — | Vis. | NM | 40 |
| Mineral Oil | — | 70 | — | — | — | 30 | Vis | NM | 51 |
| Mineral Oil | — | 30 | 70 | — | — | — | Vis | NM | 167 |
| Mineral Oil | 50 | — | — | — | 50 | — | Vis | NM | 215 |
| Silicone Oil | — | 30 | 70 | — | — | — | Vis | DG | 96 |
| Mineral Oil | — | 30 | 70 | — | — | — | UV[#] | NM | 121 |
| Mineral Oil | — | 30 | 70 | — | — | — | UV* | NM | 29 |

[+]All compositions contained 100 mL of the dispersing medium, 2.0 g of (4-octyloxyphenyl)phenyliodonium hexafluoroantimonate (IOC-8), 25 g monomers and 0.2 g perylene. Photopolymerizations were conducted for 60 minutes at 25° C.
*Formulation did not contain a photosensitizer.
[†]Determined by tiration.
[#]isopropylthioxanthone (0.2 wt %) used as a photosensitizer.
[a]Porogens (15 g) NM, nitromethane, DG, diglyme.

What is claimed is:

1. A population of polymeric microbeads bearing epoxy functionality on surfaces thereof and having a narrow particle size distribution, such that the particle size of greater than 90% of the polymeric microbeads in said population is equal to ±20% of the mean particle size, said epoxy functionality arising from one or more multifunctional epoxy monomers chosen from the group consisting of 3,4-epoxycyclohexyl methyl-3',4'-epoxycyclohexane arboxylate, bis-(3,4-epoxycyclohexyl) adipate, 4-vinylcyclohexene dioxide, epoxy silicone resins, limonene dioxide, dicyclopentadiene dioxide, bisphenol-A diglycidyl ether, bisphenol-F diglycidyl ether, 1,4-butanediol diglycidyl ether, diglycidyl ethers of tetrabromo-bisphenol-A, epoxy cresol novolacs, epoxy phenol novolacs, and diglycidyl phthalate.

2. A population of polymeric microbeads according to claim 1, wherein the epoxy functionality arises from one or more multifunctional epoxy monomers chosen from the group consisting of: 3,4-epoxycyclohexyl methyl-3',4'-epoxycyclohexane carboxylate, 4-vinylcyclohexene dioxide and the compounds of formula I and II:

3. Polymeric microbeads according to claim 1 prepared by cationic suspension photopolymerization of 3,4-epoxycyclohexylmethyl 3',4'-epoxycyclohexanecarboxylate in a mineral oil suspending medium, in the presence of (4-decyloxyphenyl) phenyliodonium hexafluoroantimonate.

4. Polymeric microbeads according to claim 1, prepared by cationic suspension photopolymerization of T8 in a mineral oil suspending medium, in the presence of (4-decyloxyphenyl) phenyliodonium hexafluoroantimonate.

5. Polymeric microbeads according to claim 1, prepared by cationic suspension photopolymerization of 4-vinylcyclohexene dioxide in a mineral oil suspending medium, in the presence of (4-decyloxyphenyl) phenyliodonium hexafluoroantimonate.

6. Polymeric microbeads prepared by suspension photopolymerization of one or more multifunctional epoxy monomers chosen from the group consisting of: 3,4-epoxycyclohexylmethyl-3',4'-epoxycyclohexane carboxylate, bis-(3,4-epoxycyclohexyl)adipate, 4-vinylcyclohexene dioxide, epoxy silicone resins, limonene dioxide, dicyclopentadiene dioxide, bisphenol-A diglycidyl ether, bisphenol-F diglycidyl ether, 1,4-butanediol diglycidyl ether, diglycidyl ethers of tetrabromo-bisphenol-A, epoxy cresol novolacs, epoxy phenol novolacs, and diglycidyl phthalate.

7. Polymeric microbeads according to claim 6, wherein the multifunctional epoxy monomers are chosen from the group consisting of: 3,4-epoxycyclohexylmethyl-3',4'-epoxycyclohexane carboxylate, 4-vinylcyclohexene dioxide and the compounds of formula I and II:

I

II

8. Polymeric microbeads according to claim 6, prepared by suspension polymerization of one or more multifunctional epoxy monomers and one or more cationically polymerizible monomers.

9. Polymeric microbeads according to claim 6, wherein said cationically polymerizible comonomers are chosen from the group consisting of: 1,2-epoxytetradecane, 1,2-epoxydecane, 1,2-epoxydodecane, epoxidized soybean oil, epoxidized linseed oil, vinyl ethers, 1-propenyl ethers, 1-butenyl ethers, styrene, indene, acenapthalene, α-methylstyrene, N-vinyl carbazole, oxazoline, tetrahydrofuran, 7-oxabicyclo[2.2.1]heptane, oxetane, substituted oxetanes, thirane, and aziridine.

10. A process for the preparation of polymeric microbeads comprising:

(A) forming a dispersion comprising one or more multifunctional epoxy monomers in a non-aqueous suspending medium in the presence of a photoinitiator; and

(B) exposing the dispersion to a source of light to induce polymerization.

11. The process of claim 10, wherein the photoinitiator is a cationic photoinitiator.

12. The process of claim 10, wherein the one or more multifunctional epoxy monomers are chosen from the group consisting of 3,4-epoxycyclohexylmethyl-3',4'-epoxycyclohexane carboxylate, bis-(3,4-epoxycyclohexyl) adipate, 4-vinylcyclohexene dioxide, epoxy silicone resins, limonene dioxide, dicyclopentadiene dioxide, bisphenol-A diglycidyl ether, bisphenol-F diglycidyl ether, 1,4-butanediol diglycidyl ether, diglycidyl ethers of tetrabromo-bisphenol-A, epoxy cresol novolacs, epoxy phenol novolacs, and diglycidyl phthalate.

13. The process of claim 12, wherein the multifunctional epoxy monomers are chosen from the group consisting of: 3,4-epoxycyclohexylmethyl-3',4'-epoxycyclohexane carboxylate, 4-vinylcyclohexene dioxide and the compounds of formula I and II:

I

14. The process of claim 10, wherein the dispersion additionally comprises one or more cationically polymerizible comonomers.

15. The process of claim 14, wherein said cationically polymerizible comonomers are chosen from the group consisting of: 1,2-epoxytetradecane, 1,2-epoxydecane, 1,2-epoxydodecane, epoxidized soybean oil, epoxidized linseed oil, vinyl ethers, 1-propenyl ethers, 1-butenyl ethers, styrene, indene, acenapthalene, α-methylstyrene, N-vinyl carbazole, oxazoline, tetrahydrofuran, 7-oxabicyclo[2.2.1]heptane, oxetane, substituted oxetanes, thirane, and aziridine.

16. The process of claim 10, wherein the polymeric microbeads.have a particle size of from 1 μm to 500 μm.

17. The process of claim 16, wherein the polymeric microbeads have a particle size of from 10 μm to 300 μm.

18. A method for attaching functional groups to the surface of a polymeric microbead comprising:

(A) preparing a dispersion of polymeric microbeads bearing residual epoxy groups on surfaces thereof by:
  (a) forming a dispersion comprising one or more multifunctional epoxy monomers in a non-aqueous suspending medium in the presence of a photoinitiator; and
  (b) exposing the dispersion to a source of light to induce polymerization; and

(B) contacting the polymericmicrobeads with a compound which is reactive toward the residual epoxy groups.

19. The method of claim 18, wherein the compound which is reactive toward the residual epoxy groups is chosen from the group consisting of: acid anhydrides, alcohols, amides, amines, carboxylic acids, isocyanates, Grignard reagents, and thiols.

20. The method of claim 18, wherein the photoinitiator is a cationic photoinitiator.

21. The method of claim 18, wherein the one or more multifunctional epoxy monomers are chosen from the group consisting of: 3,4-epoxycyclohexylmethyl-3',4'-epoxycyclohexane carboxylate, bis-(3,4-epoxycyclohexyl) adipate, 4-vinylcyclohexene dioxide, epoxy silicone resins, limonene dioxide, dicyclopentadiene dioxide, bisphenol-A diglycidyl ether, bisphenol-F diglycidyl ether, 1,4-butanediol diglycidyl ether, diglycidyl ethers of tetrabromobisphenol-A, epoxy cresol novolacs, epoxy phenol novolacs, and diglycidyl phthalate.

22. The method of claim 21, wherein the multifunctional epoxy monomers are chosen from the group consisting of: 3,4-epoxycyclohexylmethyl-3',4'-epoxycyclohexane carboxylate, 4-vinylcyclohexene dioxide and the compounds of formula I and II:

II

23. The method of claim 18, wherein the dispersion additionally comprises one or more cationically polymerizible comonomers.

24. The method of claim 23, wherein said cationically polymerizible comonomers are chosen from the group consisting of 1,2-epoxytetradecane, 1,2-epoxydecane, 1,2-epoxydodecane, epoxidized soybean oil, epoxidized linseed oil, vinyl ethers, 1-propenyl ethers, 1-butenyl ethers, styrene, indene, acenapthalene, α-methylstyrene, N-vinyl carbazole, oxazoline, tetrahydrofuran, 7-oxabicyclo[2.2.1]heptane, oxetane, substituted oxetanes, thirane, and aziridine.

25. The method of claim 18, wherein the polymeric microbeads have a particle size of from 1 μm to 500 μm.

26. The method of claim 25, wherein the polymeric microbeads have a particle size of from 10 μm to 300 μm.

* * * * *

UNITED STATES PATENT AND TRADEMARK OFFICE
CERTIFICATE OF CORRECTION

PATENT NO. : 6,602,602 B1
DATED : August 5, 2003
INVENTOR(S) : Crivello

It is certified that error appears in the above-identified patent and that said Letters Patent is hereby corrected as shown below:

Title page,
Item [73], Assignee, delete the word "Renssealer" and insert -- Rensselaer --

Column 15,
Line 42, delete the "." between the words "microbeads" and "have"

Column 16,
Line 25, delete the word "polymericmicrobeads" and insert -- polymeric microbeads --

Signed and Sealed this

Seventh Day of October, 2003

JAMES E. ROGAN
*Director of the United States Patent and Trademark Office*